US007520965B2

(12) United States Patent
Wei

(10) Patent No.: US 7,520,965 B2
(45) Date of Patent: *Apr. 21, 2009

(54) MAGNETRON SPUTTERING APPARATUS AND METHOD FOR DEPOSITING A COATING USING SAME

(75) Inventor: Ronghua Wei, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 120 days.

This patent is subject to a terminal disclaimer.

(21) Appl. No.: 10/963,341

(22) Filed: Oct. 12, 2004

(65) Prior Publication Data

US 2006/0076235 A1   Apr. 13, 2006

(51) Int. Cl.
   *C23C 14/35* (2006.01)
(52) U.S. Cl. ............... 204/192.12; 204/298.09; 204/298.2; 204/298.21; 204/298.22
(58) Field of Classification Search ........... 204/298.09, 204/298.2, 298.21, 298.22, 298.23, 192.12
See application file for complete search history.

(56) References Cited

U.S. PATENT DOCUMENTS

| | | | | |
|---|---|---|---|---|
| 4,009,090 A | * | 2/1977 | Veigel | 204/192.26 |
| 4,179,351 A | * | 12/1979 | Hawton et al. | 204/298.09 |
| 4,221,652 A | * | 9/1980 | Kuriyama | 204/298.22 |
| 4,376,025 A | | 3/1983 | Zega | |
| 4,407,713 A | * | 10/1983 | Zega | 204/298.22 |
| 4,444,643 A | * | 4/1984 | Garrett | 204/298.2 |
| 4,478,703 A | * | 10/1984 | Edamura et al. | 204/298.28 |
| 4,525,264 A | * | 6/1985 | Hoffman | 204/298.22 |

(Continued)

FOREIGN PATENT DOCUMENTS

| | | | |
|---|---|---|---|
| GB | 2125441 A | * | 3/1984 |
| JP | 59-215484 | | 12/1984 |
| JP | 04-107268 | * | 4/1992 |

OTHER PUBLICATIONS

Malik et al. Development of an energetic Ion assistec mixing and deposition process for TiNx and diamondlike carbon films, using a co-axial geometry in plasma source Ion implantation; J. Vac. Sci. Technol., Nov./Dec. 1997, 2872-2879, A15, American Vacuum Society.

(Continued)

*Primary Examiner*—Rodney G McDonald
(74) *Attorney, Agent, or Firm*—Grossman, Tucker et. al.

(57) ABSTRACT

A method for depositing a coating using a magnetron sputtering apparatus and a magnetron sputtering apparatus comprising: a support structure comprising a hollowed shaft comprising a central conduit having a longitudinal axis; a sputter target material defining a bore which is external to the central conduit, the bore also having the longitudinal axis a magnet assembly supported about the support structure, the magnet assembly having a first end, a second end, and a plurality of magnets supported therebetween and being effective, upon rotation, to generate a circumferential external magnetic field about the sputter target material; a first sealed end extending radially inward from adjacent the sputter target material proximate the first end of the magnet assembly and a second sealed end extending radially inward from adjacent the sputter target material proximate the second end of the magnet assembly, wherein the first sealed end, the second sealed end, and the sputter target material seal the magnet assembly therebetween; a cooling system comprising one or more coolant passage extending through the magnet assembly, the central conduit comprising a coolant inlet and a coolant outlet at the first sealed end; and, one or more rotors supported about the support structure and rotatable therewith by coolant passing through the one or more coolant passages.

18 Claims, 6 Drawing Sheets

U.S. PATENT DOCUMENTS

| | | | |
|---|---|---|---|
| 4,818,359 A | | 4/1989 | Jones et al. |
| 4,960,753 A | | 10/1990 | Collins et al. |
| 5,015,493 A | | 5/1991 | Gruen |
| 5,096,562 A | * | 3/1992 | Boozenny et al. ...... 204/298.22 |
| 5,272,735 A | * | 12/1993 | Bryan et al. ................. 376/261 |
| 6,338,777 B1 | | 1/2002 | Longstreth White |
| 6,767,436 B2 | | 7/2004 | Wei |

OTHER PUBLICATIONS

Ensinger, An Apparatus for sputter coating: the Inner walls of tubes, Rev. Sci. Instrum, Jan. 1996, 318-321, 67(1), American Institute of Physics.

Hosokawa et al, Self-Sputtering phenomena in high-rate coaxial cylindrical magnetron sputtering, J. Vac. Sci. Technol., Jan./Feb. 1977, 143-146, 14(1), American Vacuum Society.

International Search Report for PCT/US2005/24110 of Jan. 31, 2006.

Written Opinion for PCT/US2005/24110 of Jan. 31, 2006.

English Translation of Japanese Publication No. JP 4-107268 also referred to as Japanese Patent Application No. H02-224696, Published Apr. 8, 1992, Entitled: "Processing Device of Mixed Gas," Inventor: Naoyoshi Fujiwara, Applicant: Toshiba Corporation, pp. 381-385.

\* cited by examiner

MAGNETRON SPUTTERING APPARATUS AND METHOD FOR DEPOSITING A COATING USING SAME

FIELD OF THE APPLICATION

The present application relates generally to a system, apparatus, and method of depositing a coating on a workpiece.

CROSS-REFERENCE TO RELATED APPLICATIONS

The present application is related to the application entitled "Method for Magenetron Sputter Deposition," filed simultaneously herewith.

BACKGROUND

Tubular workpieces, such as gun barrels and engine cylinders, often require hard, wear-resistant, and/or corrosion resistant interior coatings. A number of techniques have been used to coat interior tubular surfaces, including magnetron sputtering. Unfortunately, the magnetron sputtering systems used to form such coatings generally have been inefficient and/or ineffective. More efficient and effective methods for applying such coatings are needed.

BRIEF SUMMARY

In one embodiment, the present application provides magnetron sputtering apparatus comprising: a support structure comprising a hollowed shaft comprising a central conduit having a longitudinal axis; a sputter target material defining a bore which is external to the central conduit, the bore also having the longitudinal axis; a magnet assembly supported about the support structure, the magnet assembly having a first end, a second end, and a plurality of magnets supported therebetween and being effective, upon rotation, to generate a circumferential external magnetic field about the sputter target material; a first sealed end extending radially inward from adjacent the sputter target material proximate the first end of the magnet assembly and a second sealed end extending radially inward from adjacent the sputter target material proximate the second end of the magnet assembly, wherein the first sealed end, the second sealed end, and the sputter target material seal the magnet assembly therebetween; a cooling system comprising one or more coolant passages extending through the magnet assembly, the central conduit comprising a coolant inlet and a coolant outlet at the first sealed end; and, one of more rotors supported about the support structure and rotatable therewith by coolant passing through the one or more coolant passages.

In one embodiment, the application provides a method for depositing a coating using a magnetron sputtering apparatus, the method comprising: providing in a vacuum a hollowed workpiece having an interior surface defining a bore having a first longitudinal axis; positioning along the first longitudinal axis a magnetron comprising a sputter target material supported around a support structure supporting one or more rotors and a magnet assembly, the sputter target material being positioned substantially radially equidistant from the interior surface of the bore; introducing fluid into a cooling system sealingly retained in the magnetron in a manner effective to cause the one or more rotors and the magnet assembly to rotate and to generate an external circumferentially directed magnetic field about the sputter target material; generating plasma in the vacuum; and, applying an electric potential to initiate ionization of the plasma and bombardment of the sputter target material to sputter target particles therefrom, thereby depositing a substantially uniform coating comprising the sputter target material on the interior surface of the bore.

BRIEF DESCRIPTION OF THE FIGURES

Exemplary systems, apparatus, and methods will now be described with reference to the accompanying simplified, diagrammatic, not-to-scale drawings. In the drawings.

DETAILED DESCRIPTION

The present application provides a system, apparatus, and method of depositing a coating on an interior surface of a substrate or workpiece utilizing a magnetron sputtering process. The method of deposition is implemented through operation of a magnetron sputtering system or assembly that includes a magnetron sputtering apparatus ("magnetron") and the workpiece. The magnetron comprises a sputter target material, from which sputter material is ejected and directed to the workpiece surface to be coated.

The workpiece is positioned in the vicinity of the magnetron and preferably, such that the interior surface to be coated is facing the sputter target material. The system, apparatus, and method herein are particularly suited for depositing a coating on a hollowed workpiece. Suitable workpieces comprise a hollow or space defined by an interior wall in which the magnetron is positioned. More preferably, the hollowed workpiece comprises a tubular structure having an elongated bore defined substantially by the interior surface to be coated and within which the magnetron is positioned during the deposition process. Examples of such workpieces include, but are not necessarily limited to gun barrels, engine cylinders, piping components, and other tubular structures.

FIGS. 1-5 depict an exemplary magnetron sputtering system ("magnetron") and/or apparatus according to the present application. FIGS. 1-5 are exemplary only, and should not be interpreted as limiting the application to the systems, apparatus, and methods specifically illustrated in these Figures and/or described in the corresponding description.

The term "magnetron sputtering system" or "magnetron" refers to the system or assembly that includes the workpiece and other components or equipment used to implement the magnetron sputtering process. In its basic form, the magnetron comprises a magnet assembly and support for the magnet assembly. The magnetron also preferably comprises the sputter target material and negative biasing apparatus for negatively biasing the sputter target material.

Figure 1:
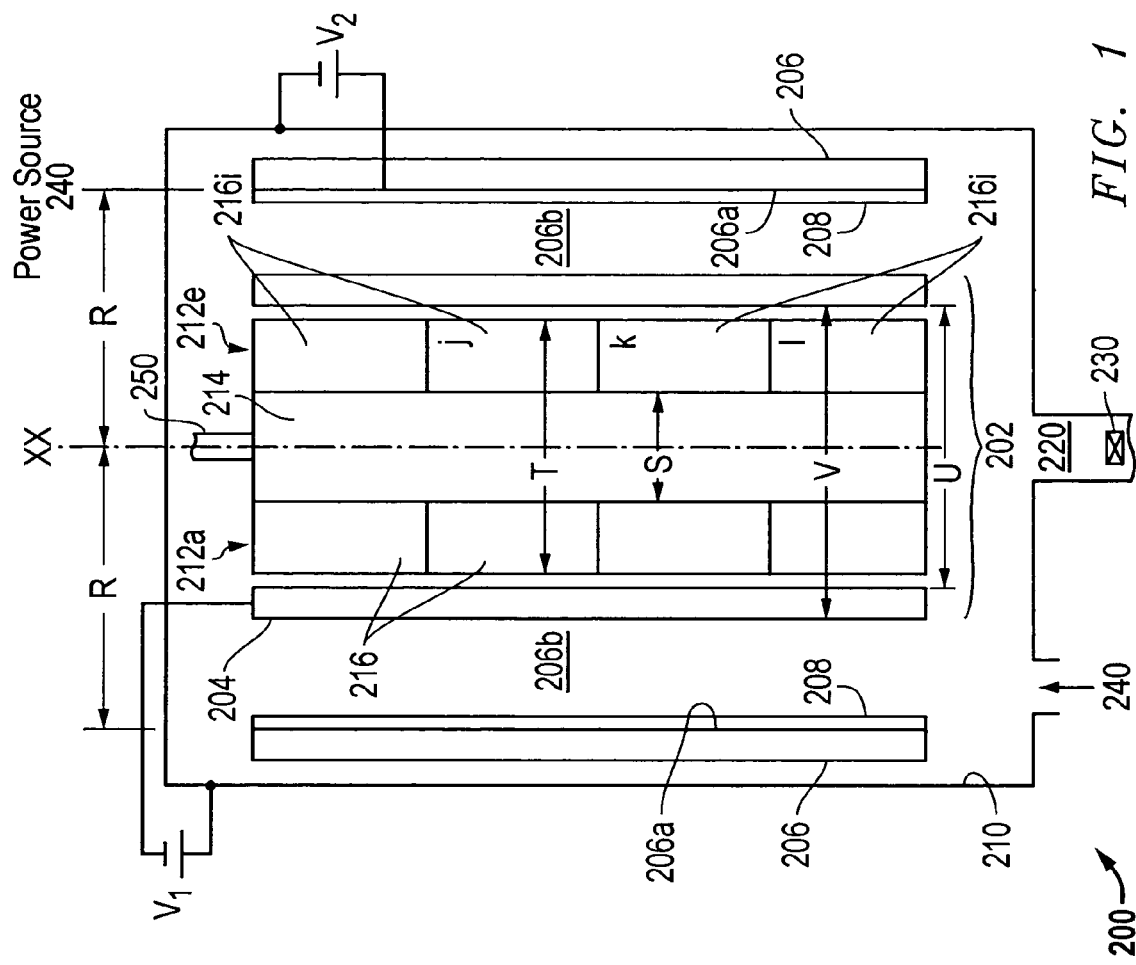
FIG. 1 is a simplified, longitudinal cross-sectional view of a magnetron sputtering system, according to the present application.

Referring to FIG. 1, a magnetron sputtering system 200 includes a magnetron sputtering apparatus or magnetron 202, a hollowed workpiece 206, and a vacuum chamber 210 housing both components. The hollowed workpiece 206 has an interior surface 206a on which a coating 208 is deposited and a cylindrical bore 206b having a radius, R, and a longitudinal axis, XX. The magnetron 202 includes a sputter target material 204, a magnet assembly 212 spaced radially inward of the target material 204, and a support structure 214, preferably a ferromagnetic support structure 214, about which magnets 216 are supported.

The magnetron 202 preferably is centrally positioned about the longitudinal axis XX of the bore 206b and extends substantially in excess of or about the length of the workpiece 206. As shown in FIG. 1, the interior surface 206a is spaced radially outward from the sputter target material 204. Thus, the magnetron 202 is disposed substantially within the bore 206b of the workpiece 206. Preferably, the magnetron 202 is positioned substantially radially equidistant from the interior surface 206a of the workpiece along the longitudinal axis of the interior surface 206a. "Substantially radially equidistant" includes a variation of about less than 10% of the diameter V of the sputter target material 204. In a preferred embodiment, the variation is less than 1% of the diameter V of the sputter target material 204.

The sputter target material 204 may be substantially any material which may be sputter deposited onto the interior surface 206a. The sputter target material 204 preferably is an elongated cylinder which, when centrally positioned within the hollowed workpiece 206, also has longitudinal axis XX. The following are substantially coaxial and located radially outward relative to one another: the external diameter of the support 214 (S); the external diameter of the magnet assembly (T); the internal diameter of the sputter target material 204 (U); the external diameter of the sputter target material (V); and the internal diameter of the interior surface 206a (R).

The support 214 may be made of a variety of materials effective to support the magnets without interfering with the coating process. The support 214 preferably comprises ferromagnetic material, most preferably iron or carbon steel. The cross-section of the support 214 may be rounded, rectangular, or any other shape suitable to support the magnet assembly 212 having a diameter sufficiently small to permit the support to be centrally positioned within the longitudinal bore of the sputter target material 204. In one embodiment, discussed below, the support structure 214 has or incorporates an elongated bore or a hollowed shaft that serves as a conduit and a rotatable drive shaft.

The magnetron sputtering system 200 comprises a vacuum chamber port 220 and a pump 230 in fluid communication with the vacuum chamber 210. The vacuum chamber 210 includes a gas feed 240 for providing a suitable gas for plasma generation. Suitable gases include inert gases, which include, but are not necessarily limited to argon, krypton, xenon, and combinations thereof. A preferred inert gas is argon. Where the coating is a ceramic coating, one or more reactive gas also is provided. Suitable reactive gases comprise an element selected from the group consisting of nitrogen and carbon in a form which reacts with ceramic precursor material to produce a ceramic coating. Examples of suitable reactive gases include, but are not necessarily limited to gaseous nitrogen, methane, acetylene, oxygen, ammonia, and combinations thereof.

The magnetron sputtering system 200 also preferably provides an energy source for negatively biasing the sputter target material 204 and an energy source for negatively biasing the inside surface 206a of the workpiece 206. In a preferred embodiment, the energy sources are voltage sources V1 and V2, respectively and associated circuitry.

A rotatable drive mechanism (partially represented and denoted by numeral 250 in FIG. 1) is another preferred component of the magnetron sputtering system 202. The rotatable drive mechanism 250 may be in the form of an assembly including a motor, drive shaft, and a coupling connection with the support structure 214. The rotatable drive mechanism 250 may further include a programmable logic controller or equivalent controller means for controlling rotation of the magnet assembly 212 during the magnetron sputtering operation. The rotatable drive mechanism 202 is operated to rotate the magnet assembly 212 relative to the sputter target material 204, thereby enhancing the deposition process, promoting a more uniform coating on the interior surface 206a, and increasing the utilization of the sputter target material.

Figure 1A:
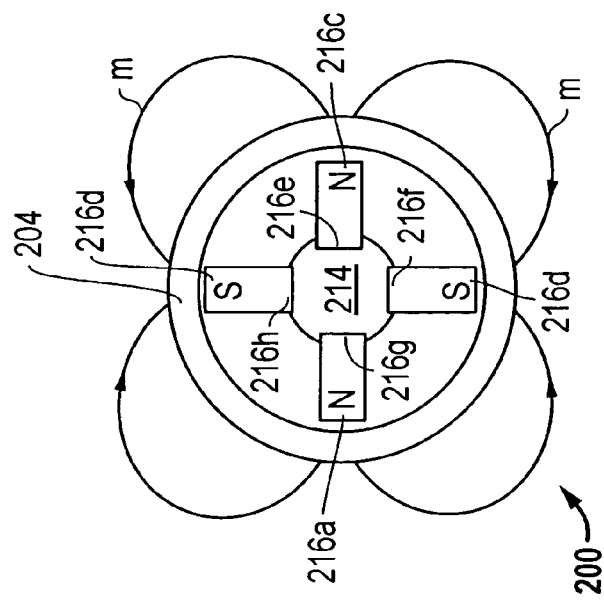
FIG. 1A is an end view of the magnetron sputtering system in FIG. 1.

The magnet assembly 212 preferably comprises elongated magnets 216 mounted along the support 214 having a central axis XX. More preferably, the magnets 216 are rectangular or bar magnets 216 circumferentially spaced apart from one another about the support 214, as shown in FIG. 1A. The phrase "circumferentially spaced apart" means that the magnets 216 are positioned at spaced intervals about the perimeter ("circumference") of the support 214. Such an arrangement does not require the support structure 214 to have a specific shape or cross section. The support structure 214 may have a circular, elliptical, rectangular, or any other number of suitable cross sections. Further, the magnets 216 may be arranged in a circular or non-circular pattern.

Referring specifically to FIG. 1A, the magnets 216 have an internal surface or pole 216e, 216f, 216g, and 216h in contact with the support structure 214 and an opposed, external surface or pole 216a, 216b, 216c, 216d positioned radially outward of the support structure 214. The internal and external surfaces, respectively, have opposite North or South polarities and the magnetic field within the magnets may be directed radially inward or outward depending on the polarity orientations. In FIG. 1A, the magnets 216 are illustrated with an indication of the polarity at the external surfaces 216a, 216b, 216c, 216d. As best shown in the end view of FIG. 1A, an even number of bar magnets are circumferentially spaced apart on the support 214. Preferably, four bar magnets 216 are circumferentially spaced apart by about 90°. The magnets 216 are further arranged about the structural support 214 such that the exposed surfaces of circumferentially adjacent magnets (e.g., 216a and 216b) have opposite polarity orientations. It should be understood that other even numbers of rows (e.g., 2, 6, 8, 10, etc.) may also be used depending on the size of the magnetron.

Referring back to FIG. 1, each row of magnets 216a-216d is preferably divided into segments 216i, 216j, 216k, and 216(l). The segments 216i, 216j, 216k, and 216(l) of each row are mounted so that all of the segments of the same row have the same polarity orientation. For example, FIG. 1 illustrates two rows of magnets 216a and 216c spaced at substantially 180°. Each segment 216i, 216j, 216k, 216(l) in a row 216a, 216b, respectively, has the same North-South polarity orientation.

The magnets generate a circumferential magnetic field, or a magnetic field directed from one row of magnets to successive rows of magnets about the perimeter of the cylindrical sputter target material 204. Preferably, the magnets generate a "circumferential external magnetic field" M having a magnetic field orientation which travels circumferentially from one circumferentially spaced magnet 216a to the next successive circumferentially spaced magnet 216b outside of the external diameter V of the cylindrical sputter target material 204. This contrasts with the typical magnetic field, which travels along the longitudinal axis XX of the magnetron sputtering system 200. The magnets generally produce a magnetic field of about 500 Gauss or more, preferably about 1000 Gauss or more.

Because of the geometric characteristics of the magnet assembly 212, the ion current density generated is relatively uniform along the length and circumference of the sputter target material 204. The ion current density generally is from about 0.01 mA/cm$^2$ to about 500 mA/cm$^2$, preferably about 20 mA/cm$^2$. In a preferred embodiment, circumferential uniformity is further promoted by rotating the sputter target material 204 relative to the workpiece 206. Rotation at optimal speed may be accomplished by operation of the rotatable drive mechanism 250.

The rate of decay of the sputter material and the deposited coating 208 are also substantially uniform, even when the sputter target material 204 and workpiece 206 are positioned in close proximity. Preferably, greater than 50 wt. % of the target material is used, more preferably 70 wt. % or more, even more preferably 80 wt. % or more, even more preferably 90 wt. % or more, and most preferably 95 wt. % or more of the target is utilized. This is, in itself, a design advantage provided by the magnetron sputtering system according to the present application, which is further exemplified in the design variations of FIGS. 2-5.

The magnetron sputter assembly in each of FIGS. 1-5 is useful to deposit substantially any coating material amenable to sputter deposition. The sputter target material 204 may be selected on the basis of application requirements, including but. not necessarily limited to wear resistance, corrosion resistance, high temperature erosion resistance, and combinations thereof. Examples of coatings that may be deposited using the magnetron include, but are not necessarily limited to metallic coatings and ceramic coatings. Suitable metallic coatings include, but are not necessarily limited to coatings comprising a metal selected from the group consisting of tantalum, titanium, aluminum, iron, copper chromium, platinum, palladium, tungsten, and combinations thereof. Suitable ceramic coatings include, but are not necessarily limited to titanium nitride, chromium carbide, aluminum oxide, titanium carbonitride, chromium nitride, aluminum nitride, tungsten nitride, and tungsten carbide.

Once the sputter target material 204 and magnetron 202 are centrally positioned within the workpiece 206, the magnetic sputter assembly is exposed to sputter deposition conditions effective to produce a substantially uniform coating. The sputter deposition conditions will vary with the particular coating. Preferably, the vacuum is pumped down to a base pressure of $10^{-6}$ to $10^{-5}$ Torr. Preferably, the interior surface of the workpiece 206a is first cleaned to remove superficial contaminants. An inert gas, such as argon gas, is backfilled into the chamber to a pressure sufficiently high to cause the magnetron to function stably as to sputter target material to deposit onto the workpiece. Suitable pressures generally are from about $10^{-4}$ to about $10^{-1}$ torr, preferably from about 0.1 to about 50 millitorr, most preferably 5 millitorr.

In a preferred embodiment, the magnet assembly 212 is biased with RF (radio frequency), DC, or pulsed DC, and the workpiece 206 is biased with DC or pulsed DC. Depending on the applied power to the magnetron and the bias voltage to the tube, coatings may be formed at temperatures as low as about 100° C., or as high as about 500° C. The biasing conditions, and the sputter deposition conditions, are maintained for a duration necessary to deposit a coating having a desired thickness. Generally, the thickness is from about 0.1 µm to about 200 µm. The time required to sputter deposit the desired thickness generally is from about 10 minutes to about 300 minutes, most preferably for about 120 minutes.

When the magnetron is biased with RF, the magnetron biasing conditions comprise RF having a pulse frequency of about 100 kHz to about 15 MHz, preferably about 13.56 MHz, at a power of from about 0 kW to about 3 kW, preferably about 1 kW, depending on the size of the magnetron.

When bias is DC or pulsed DC, the magnet assembly and/or the workpiece biasing conditions comprise a pulse frequency of from about 100 Hz to about 3 kHz, preferably from about 1 kHz to about 2 kHz, a pulse width of from about 5 microseconds to about 300 microseconds, preferably about 20 microseconds. The magnetron biasing conditions comprise DC voltage of about 1000 V or less and pulsed DC voltage of about 100 V to about 1200V and a power of from about 100 W to about 5 kW depending on the size of the magnetron. In a preferred embodiment, the magnetron biasing conditions comprise a power of about 1 kW, preferably for a magnetron having a diameter of about 2" and a length of about 24". The workpiece biasing conditions are substantially the same as the magnetron biasing conditions with the exception of reduced voltage and consequently reduced power. The workpiece biasing conditions generally comprise about 1000 V or less, preferably from about 0 to about 500 V, more preferably abut 250 V, most preferably about 50 V.

Where the coating is a metallic coating, a sputter target material 204 comprising one or more selected metal is mounted on supports about the magnet assembly 212. Before initiating the actual sputtering of the target material, the pump 230 is operated to evacuate the vacuum chamber 210 to a pressure of about $10^{-6}$ to $10^{-5}$ torr. A suitable gas is introduced into the vacuum chamber 210. For deposition of a metallic coating, suitable gases are inert gases, which include, but are not necessarily limited to argon, krypton, xenon, and combinations thereof. This gas is fed into the chamber 210 under sputter deposition conditions effective to produce a substantially uniform coating of the particular metal. In a preferred embodiment, the gas is substantially continuously fed into the chamber through the duration of the process.

The magnetron 202 is biased, preferably negatively biased. The magnetron may be biased with radio frequency (RF) or negative voltage in the form of DC power or pulse DC power. Where DC power or pulse DC power is used, voltage control V1 is activated to negatively bias the magnet assembly 212 and voltage control V2 is activated to ground or negatively bias the workpiece 206.

Positive ions from the plasma are accelerated toward the negatively charged sputter target material 204 with sufficient energy to remove or sputter target particles from the sputter target material 204. Electrons freed during the ion bombardment process are confined by the magnetic field, M, generated around the sputter target material 204 and contribute to further ionization. In the meantime, the sputtered particles and are deposited onto the interior surface of the workpiece 206 to form a substantially uniform metallic coating 208 having a desired thickness. As used herein, a "substantially uniform coating" refers to the interior surface being completely covered by a coating having a desired thickness, preferably, a coating having a uniformity of thickness of about +/−20% or less of the desired coating thickness along its length.

In another embodiment, a ceramic coating is deposited onto the interior surface of the tubular workpiece. A suitable target material 204 is first selected depending on the type of ceramic coating to be formed, the characteristics of the workpiece 206, and the desired characteristics of the coating itself. The sputter target material generally comprises silicon or the metal component of the ceramic. Preferred sputter target materials include, but are not necessarily limited to titanium, chromium, aluminum, silicon, tungsten, molybdenum, boron, and combinations thereof. The vacuum chamber 210 is pumped down to about $10^{-6}$ to $10^{-5}$ torr. Then, a reactive gas effective to form the desired ceramic is fed to the chamber. Suitable reactive gases for the formation of ceramic coatings include, but are not necessarily limited to nitrogen, methane, acetylene, oxygen, ammonia, and combinations thereof. In a preferred embodiment, the reactive gas further comprises an inert gas, preferably argon. The assembly is subjected to sputter deposition conditions effective to produce a substantially uniform ceramic coating.

For example, where the ceramic coating is TiN, titanium is chosen as the sputter target material. After adjusting the pressure in the chamber, a combination of argon and nitrogen at a ratio of about 80 vol. % to 20 vol. % is fed to the chamber at a rate of about 200 standard cubic centimeters per minutes (SCCM). The biasing mechanism is activated to negatively bias the magnet assembly 212, and to either ground or negatively bias the workpiece 206. The magnetron 202 is activated, and titanium atoms are sputtered from the titanium sputter target material and deposited onto the interior surface 206a of the workpiece 206. The chamber conditions are effective to induce the reactive gas (nitrogen) to react with the metal (Ti) to form the desired coating (e.g., N reacts with Ti to form TiN). For TiN, the conditions include a temperature of about 400° C. The process is continued for a period sufficient to form a substantially uniform coating of TiN having a thickness of from about 0.5 micrometers to about 3 micrometers. This generally requires a time period of about 3 hours. Upon completion, the coated workpiece 206 is removed from the vacuum chamber 210.

In another embodiment, a ceramic coating is deposited onto the interior surface of the hollowed workpiece, preferably a tubular workpiece, via sputtering a ceramic target. Substantially any ceramic target may be used as long as it is amenable to sputtering. Preferred ceramic targets for this embodiment include, but are not necessarily limited to titanium boride and tungsten carbide.

Figure 2:
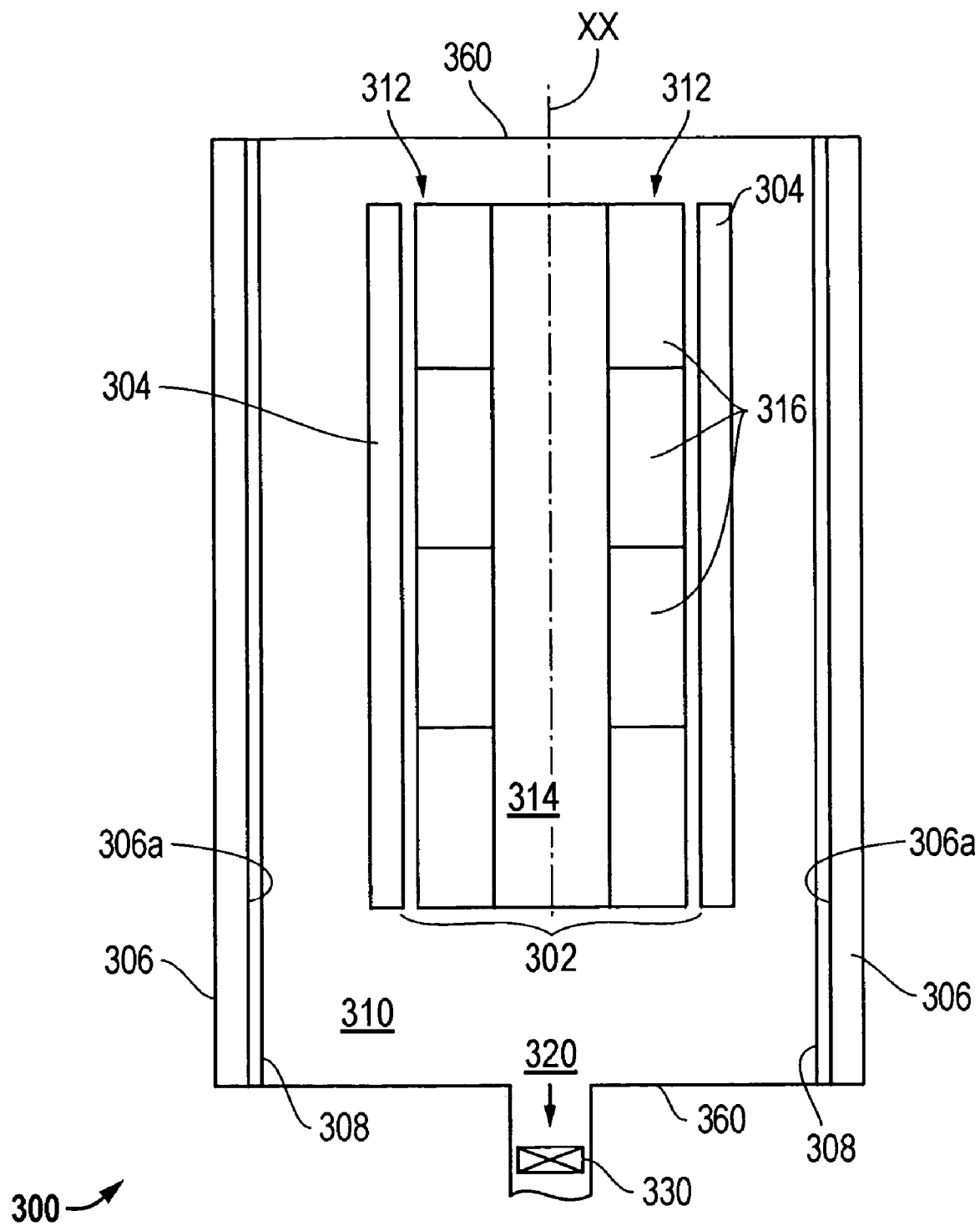
FIG. 2 is a simplified, longitudinal cross-sectional view of an alternative magnetron sputtering system, according to the present application.

FIG. 2 illustrates a variation of the magnetron sputtering system 300 of FIG. 1. Specifically, FIG. 2 depicts a magnetron sputtering system 300 wherein the workpiece 306 provides, at least partially, the walls of the vacuum chamber 308. In this magnetron sputtering system 300, the ends of the hollowed workpiece 306 are sealed, via a cap, plate or equivalent sealing means, so as to complete the vacuum chamber 310. The magnetron 302, including magnets 316 and cylindrical sputter target material 304, are centrally situated within the vacuum chamber 310.

As with the magnetron sputtering system 200 of FIG. 2, the vacuum chamber 310, or more specifically, one of the sealed ends 360, is provided with a port 320 in fluid communication with a pump 330. The magnetron sputtering system 300 also comprises appropriate power supplies, gas feeds, and other components. See, e.g., U.S. Pat. No. 6,767,436, incorporated herein by reference.

The magnet assembly 312 comprises magnets 316 in an arrangement effective to generate a circumferential magnetic field about the sputter target material 304. The circumferential magnetic field preferably is effective to produce a substantially uniform sputter deposited coating and to use greater than 50 wt. %, preferably 70 wt. % or more, more preferably 80 wt. % or more, even more preferably 90 wt. % or more, most preferably 95 wt. % or more of the sputter target material 304. It is not necessary to widen the space between the sputter target material 304 and the interior surface 306a of the workpiece 306 in order to achieve uniform deposition of coating on the interior surface of the workpiece. Accordingly, a uniform coating is formed even on workpieces having relatively small bores, preferably as small as 2 inches or less, more preferably as small as 1 inch or less.

Figure 3:
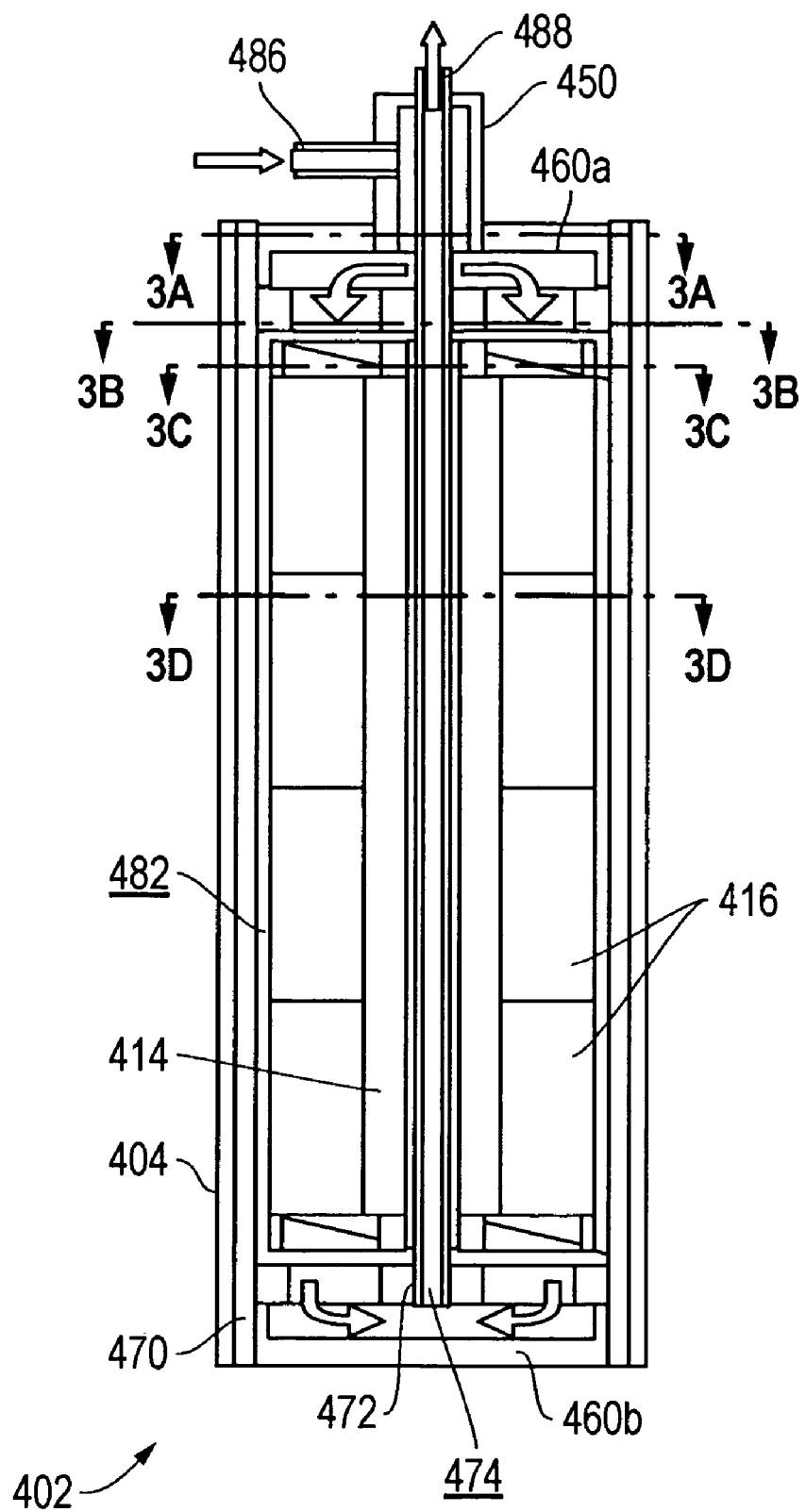
FIG. 3 is a simplified, longitudinal cross-sectional view of an alternative magnetron sputtering apparatus, according to the present application.

FIG. 3 depicts another variation of the magnetrons 202, 302 of FIGS. 1 and 2, respectively. In this embodiment, the magnetron 402 includes sealed end caps 460a, 460b that enclose the magnetron 402 and, as further described below, enclose a cooling system.

The magnetron 402 is centrally situated within the bore of the workpiece (not shown). As with the magnetrons of FIGS. 1 and 2, the magnetron 402 includes a magnet assembly 412 of segmented bar magnets 416 supported about an elongated support structure 414. The magnet assembly 412 is arranged to generate a circumferentially directed magnetic field about the sputter target material 404. The support structure 414 is amended, in this design variation, by provision of an inner shaft or support tube 472. The support tube 472 defines a central longitudinal conduit 474 that extends from one end of the magnetron 402 to the opposite end.

Figure 3A:
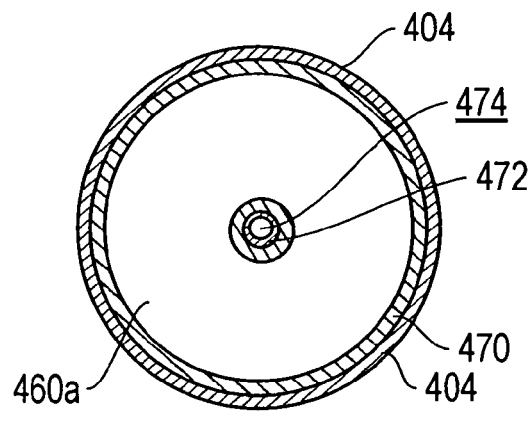
FIG. 3A is a cross-sectional view from line 3A-3A through the magnetron sputtering apparatus in FIG. 3.

As best shown in the cross-sectional view of FIG. 3A, the cylindrical sputter target material 404 is mounted about an outer support tube 470. The support tube 470 is spaced radially outward of the magnets 416, thereby providing a circumferential gap 482 therebetween. The ends of the support tube 470 are sealingly engaged by end plugs 460a, 460b to enclose the magnets 416 therebetween and to form a sealed interior and cooling system.

Figure 3B:
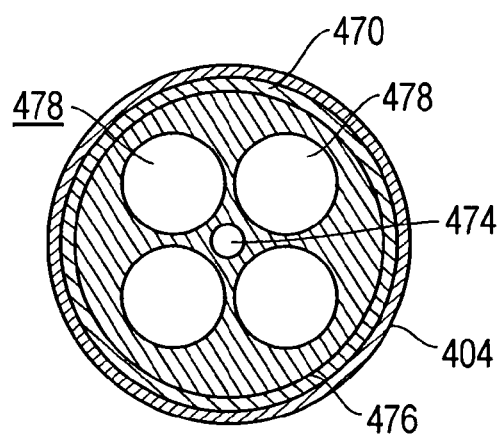
FIG. 3B is a cross-sectional view from line 3B-3B through the magnetron sputtering apparatus in FIG. 3.

The magnetron 402 of FIG. 3 comprises an integrated coolant system with a plurality of coolant passages passing adjacent to the magnet assembly 412. The central conduit 474 provides one coolant passage. In particular, the central conduit 474 provides a return, hot coolant passage. Referring to FIG. 3B, a coolant distributor plate 476 is mounted about the inner tube 472 just across each end cap 460a, 460b. The distributor plates 476 include a plurality of ports 478 that are aligned with the channel space between the magnets 416 (see e.g., FIG. 3D). The distributor plates 476 further include a port for the central conduit 474.

Figure 3C:
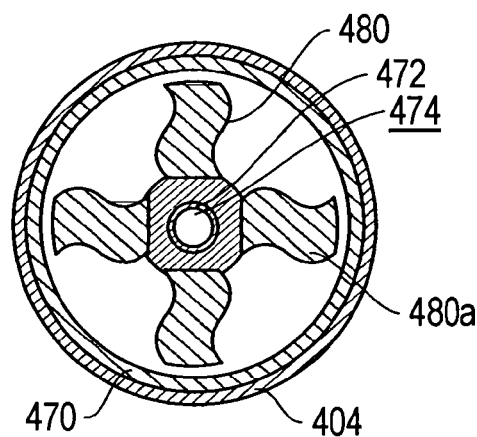
FIG. 3C is a lateral cross-sectional view from line 3C-3C through the magnetron sputtering apparatus in FIG. 4.
Figure 3D:
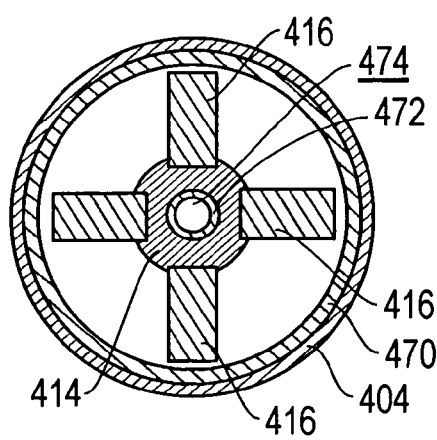
FIG. 3D is a lateral cross-sectional view from line 3D-3D through the magnetron sputtering apparatus in FIG. 3.

Referring to FIG. 3C, a rotor 480 is situated inwardly of each distributor plate 476. Preferably, the rotor 480 is mounted about the inner tube 472 and just forward of the magnet assembly 412, and such that rotor blades 480a of the rotor 480 are positioned in the coolant passage. The rotor blades 480a interact, therefore, with coolant passing through the coolant passage. Specifically, the moving coolant imparts fluid momentum upon the rotor blades 480a, thereby rotating the rotor 480. The rotor 480, which is fixedly connected with the rest of the support structure 414, rotates around the inner tube 472. In this way, the magnet assembly 412 is rotated relative to the sputter target material 404.

In further variations, the rotor 480 may be mounted on a bearing mounted on the inner tube 472. In this design, the rotor 480 is rotatable independent of the inner tube 472. Instead, the rotor 480 may be fixed directly to the rest of the support structure 414 or to the magnet assembly 412. In further configurations, the rotor blades 480a may be connected with the sputter target material 404 or the outer support tube 470. In these further configurations, rotation of the rotor 480 effects rotation of the sputter target material 404 relative to the magnet assembly 412.

The rotatable drive mechanism is energized by momentum of the flowing coolant in the cooling system (rather than an electrical source such as an external motor). Preferably, the coolant is pumped by an external pump or pressure differential (e.g., liquid head).

Coolant enters the magnetron 402 through a coolant inlet 486 and passes through the first distributor plate 476 (see arrows in FIG. 3), and then past the rotor 480. From the ports 478, the coolant passes through the magnet assembly 412 by way of channels between the rows of magnets 416, thereby convectively cooling the magnets 416. Coolant also passes by the outer support tube 470 and through the circumferential gaps 482. By convectively cooling the outer support tube 470, the coolant also cools the sputter target material 404. The second distributor plate 476 at the second end provides an outlet of the coolant and directs the hot coolant into the central conduit 474. The hot coolant returns through the central conduit 474 and out through an outlet 488 at the first end of the magnet. The hot coolant may be re-circulated by way of a suitable heat exchange system.

Figure 4:
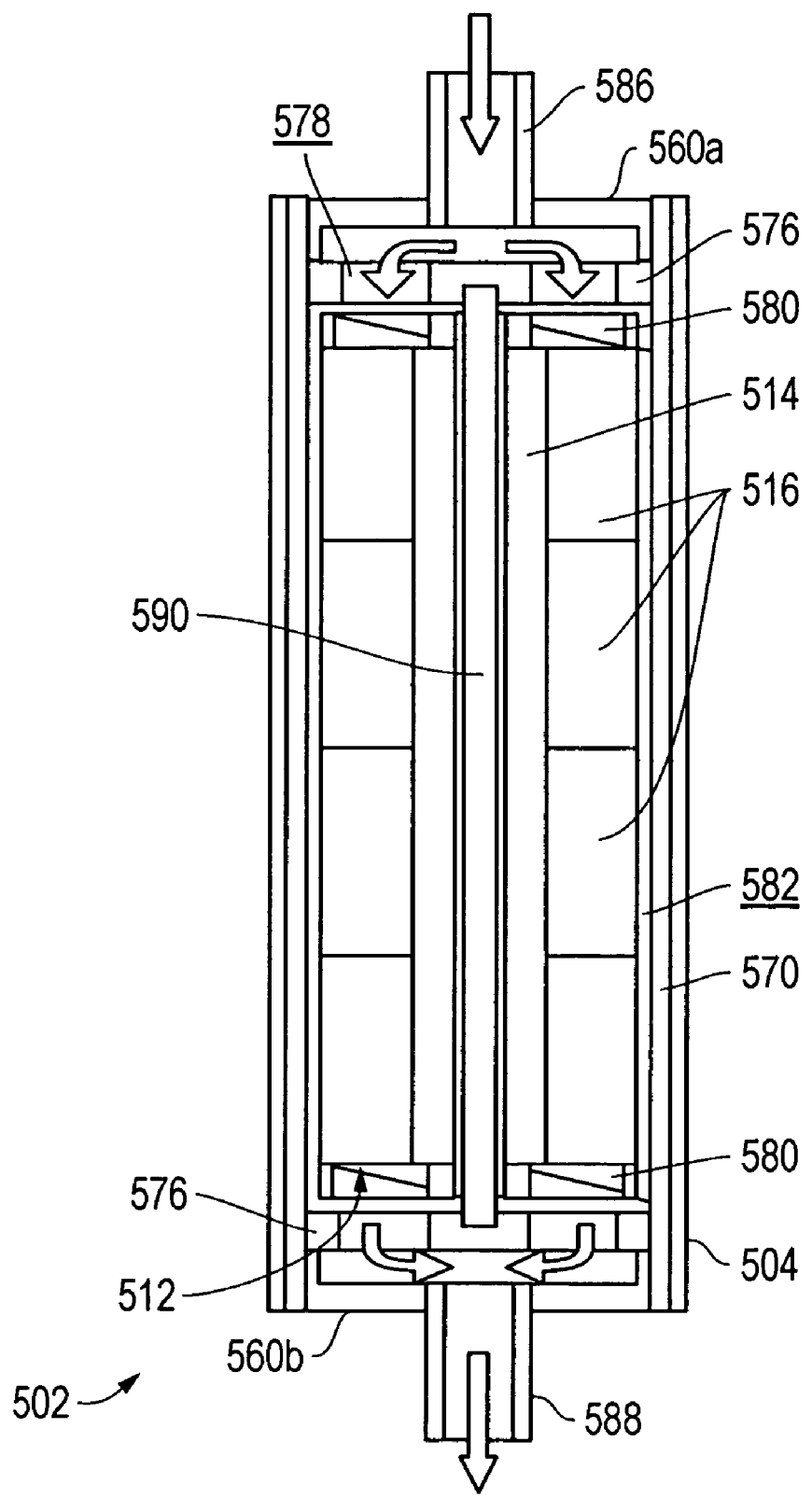
FIG. 4 is a simplified, longitudinal, cross-sectional view of another alternative magnetron sputtering apparatus, according to the present application.

FIG. 4 provides a variation of the magnetron 402 of FIG. 3. A magnetron 502 according to this design employs a magnet assembly 512 that is arranged similarly to that of the magnetron 402 in FIG. 3 and generates a magnetic field having the same characteristics. The magnetron 502 also includes a cylindrical sputter target material 504 disposed about an outer support tube 570. The outer support tube 570 is spaced radially outward of the magnet assembly 512 to form a circumferential gap 582 therebetween. In contrast to the magnetron 402 of FIG. 3, the support structure 514 does not include an inner tube 472; the magnetron 502 includes, instead, an inner shaft 590 about which the rest of the support structure 514 is mounted. As with the magnetron 402 of FIG. 3, the magnetron 502 is provided with end caps or plugs 560a, 560b, to enclose the interior and a coolant system therein. The magnetron 502 is provided, however, with a coolant inlet 586 on a first end and a coolant outlet 588 on the second, opposite end. The solid shaft 590 does not provide a coolant return conduit as with the magnetron 402 of FIG. 3, but does support rotor 580.

In this design, coolant enters through the inlet 586 and is directed along channels extending between the magnets 516 and through the circumferential gap 582. The hot coolant is discharged at the second end through the coolant outlet 588. As before, the passing coolant rotates the pair of rotors 580, thereby rotatably driving the support structure 514 and the magnet assembly 512 during the sputter deposition process.

Figure 5:
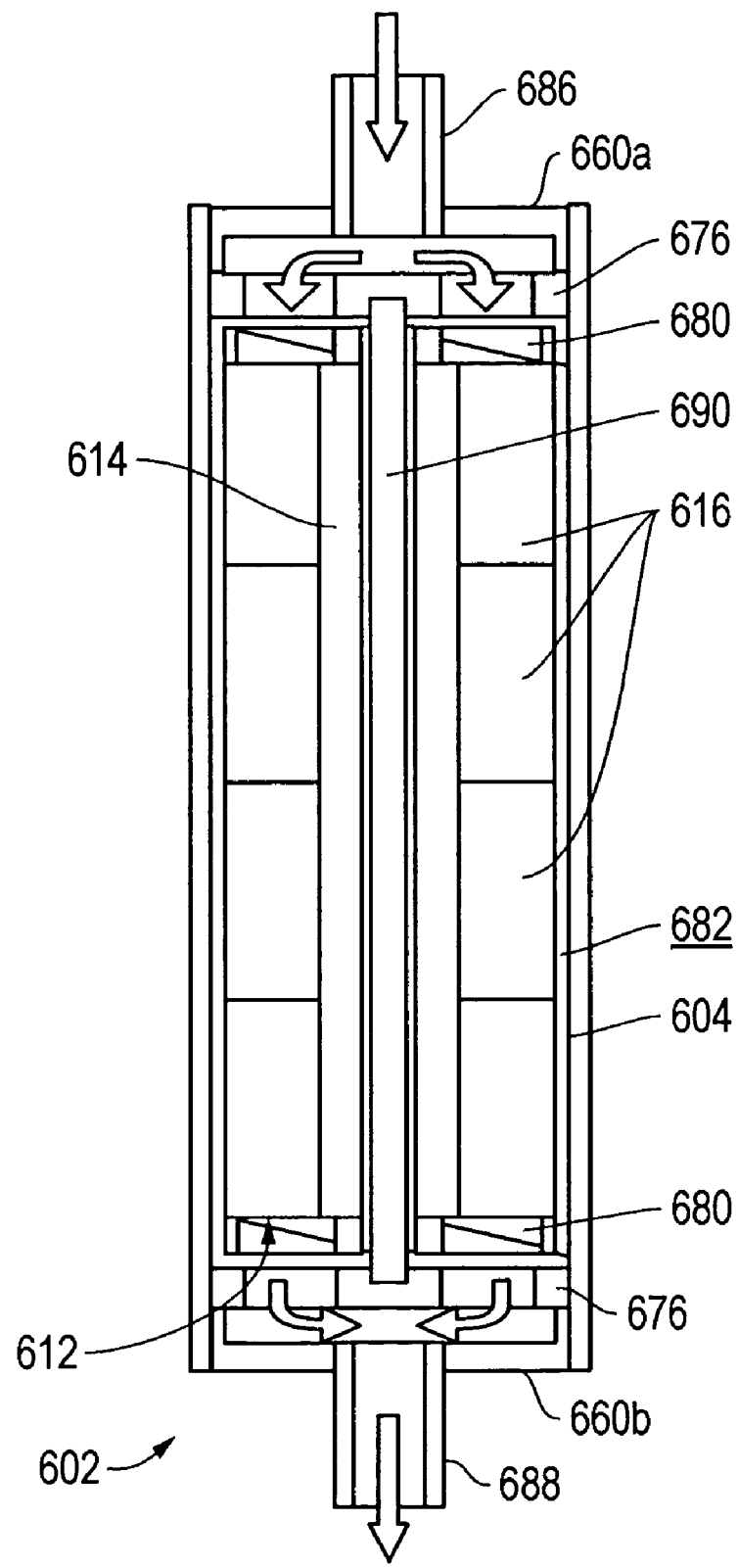
FIG. 5 is a simplified longitudinal cross-sectional view of yet another magnetron sputtering apparatus, according to the present application.

FIG. 5 illustrates, in simplified form, yet a further variation of the magnetrons depicted in FIGS. 1-4. Operation of this magnetron 602 effects direct cooling of the sputter target material 604, as well as the assembly 612 of magnets 616. As with the magnetron 502 of FIG. 4, the magnetron 602 of this design is provided with a coolant inlet 686 at one end and a coolant outlet 688 at a second, opposite end. The magnetron 602 does not, however, employ an outer tube (see e.g. outer tube 570) about which the sputter target material 604 is mounted. The sputter target material 604 is directly spaced across from the magnet assembly 612, thereby defining a circumferential gap 682 therebetween. End caps or plugs 660a, 660b are provided at the ends of the magnetron 602 to sealingly engage the cylindrical sputter target material 604, thereby enclosing the interior of the magnetron 602.

In the operation of the magnetron 602, coolant is directed through the inlet 686 and through the channels between the magnets 616 and the circumferential gap 682, thereby directly convectively cooling the magnets 616 as well as the sputter target material 604. The hot coolant is then discharged at the opposite end and through coolant outlet 688. Passing of the coolant through the cooling system also rotates rotors 680, thereby rotating the magnet assembly 612 relative to the sputter target material 604 during the deposition process.

Persons of ordinary skill in the relevant chemical, mechanical, and other relevant art will recognize that further modifications and variations may be made to the structures, methods, and assemblies described in respect to FIGS. 1-5, without departing from the spirit and scope of the present application. Processes and structures previously described are meant to be illustrative only and should not be taken as limiting the application, which is defined by the claims below. The Figures have also been described and illustrated so as to explain the best modes for practicing the system, apparatus, and method according to the application.

I claim:

1. A magnetron sputtering apparatus comprising:
   a workpiece comprising walls defining a vacuum chamber in fluid communication with a gas feed, the vacuum chamber having a first central longitudinal axis extending longitudinally from a first sealed end to a second sealed end;
   a magnetron disposed within the vacuum chamber, the magnetron comprising a support structure comprising a shaft having the first central longitudinal axis;
   a sputter target material defining a bore which is external to the shaft, the bore also having the first central longitudinal axis;
   a magnet assembly supported about the support structure, the magnet assembly having a first end, a second end, and a plurality of magnets supported therebetween and being effective, upon rotation, to generate a circumferential external magnetic field about the sputter target material;
   a third sealed end extending radially inward from adjacent the sputter target material proximate the first end of the magnet assembly and a fourth sealed end extending radially inward from adjacent the sputter target material proximate the second end of the magnet assembly, wherein the third sealed end, the fourth sealed end, and the sputter target material seal the magnet assembly therebetween;
   a cooling system comprising one or more coolant passages extending through the magnet assembly;
   a distributor plate including a plurality of ports aligned with the coolant passages and
   one or more rotors including one or more rotor blades supported about the support structure configured to rotate the magnetic assembly relative to the sputter target material in a coaxial manner around the first central longitudinal axis by the passage of coolant, wherein the rotor is situated inwardly of the distributor plate such that the rotor blades are positioned in the coolant passage.

2. The magnetron sputtering apparatus of claim 1, wherein the support structure extends longitudinally from proximate the first end of the magnet assembly to proximate the second end of the magnet assembly, the one or more second rotors being connected with the support structure proximate the second end and the one or more first rotors being connected with the support structure proximate the first end.

3. The magnetron sputtering apparatus of claim 1, wherein the magnet assembly includes a plurality of magnets circumferentially spaced apart about the support structure, the cooling system including a plurality of coolant passages extending between the circumferentially spaced apart magnets.

4. The magnetron sputtering apparatus of claim 3, wherein the magnet assembly forms a plurality of longitudinally extending, circumferentially spaced apart rows of magnets.

5. The magnetron sputtering apparatus of claim 4 wherein the polarity orientation of the rows of magnets changes between each successive row.

6. The magnetron sputtering apparatus of claim 1, further comprising an outer support tube about which the sputter target material is supported, the magnet assembly being rotatable relative to the outer support tube.

7. The magnetron sputtering apparatus of claim 1 further comprising:
 a first energy source in communication with the sputter target material; and
 a second energy source in communication with the workpiece.

8. The magnetron sputtering apparatus of claim 1 wherein the sputter target material is metallic.

9. The magnetron sputtering apparatus of claim 1, wherein:
 the shaft comprises a central conduit comprising a coolant inlet and a coolant outlet at the third sealed end.

10. The magnetron sputtering apparatus of claim 1, wherein the vacuum chamber has an internal diameter of about 2 inches or less.

11. The magnetron sputtering apparatus of claim 1, wherein the vacuum chamber has an internal diameter of about 1 inch or less.

12. A method for depositing a coating using a magnetron sputtering apparatus, the method comprising:
 providing a hollowed workpiece having an interior surface defining a bore having a first central longitudinal axis, the bore extending from a first end to a second end;
 positioning along the first central longitudinal axis a magnetron comprising a sputter target material supported around a support structure supporting a rotor, a magnet assembly, a cooling system sealingly retained in the magnetron comprising one or more coolant passages extending through the magnet assembly, a distributor plate including a plurality of ports aligned with the coolant passages and one or more rotors including one or more rotor blades supported about the support structure wherein the rotor is situated inwardly of the distributor plate such that the rotor blades are positioned in the coolant passage, the sputter target material being positioned substantially radially equidistant from the interior surface of the bore;
 sealing the first end and the second end of the bore, thereby forming a vacuum chamber in fluid communication with a gaseous feed;
 evacuating the vacuum chamber to a negative pressure;
 introducing fluid into the cooling system in a manner effective to cause the rotor and the magnet assembly to rotate relative to the sputter target material in a coaxial manner around the first central longitudinal axis;
 rotating the magnet assembly to generate an external circumferentially directed magnetic field about the sputter target material;
 generating plasma in the vacuum chamber; and
 applying an electric potential to initiate ionization of the plasma and bombardment of the sputter target material to sputter target particles therefrom, thereby depositing a substantially uniform coating comprising the sputter target material on the interior surface of the bore.

13. The method of claim 12, wherein the support structure comprises a central conduit, the method further comprising introducing fluid into the cooling system via the central conduit and removing fluid from the cooling system via the conduit.

14. The method of claim 12, wherein the sputter target material is metallic.

15. The method of claim 12, further comprising using greater than 90 wt. % of the sputter target material.

16. The method of claim 12, further comprising maintaining a substantially uniform ion current density along the length and circumference of the sputter target material.

17. The method of claim 12 wherein the substantially uniform coating has a thickness of from about 0.1 μm to about 200 μm with a uniformity of thickness of about +/− 20% or less along its length.

18. The method of claim 12 further comprising supplying to the vacuum chamber reactive gas effective to react with said sputter target material to form a ceramic coating, the reactive gas comprising an element selected from the group consisting of nitrogen, carbon, and combinations thereof.

* * * * *